United States Patent [19]

Simpson

[11] 4,388,255

[45] Jun. 14, 1983

[54] METHOD FOR PRODUCING PRE-SHAPED α-SILICON NITRIDE WHISKER COMPACTS AND LOOSE WHISKERS FOR COMPOSITE MATERIAL REINFORCEMENT

[75] Inventor: Frederick H. Simpson, Seattle, Wash.

[73] Assignee: Boeing Aerospace Co. (A Division of the Boeing Company), Seattle, Wash.

[21] Appl. No.: 248,498

[22] Filed: Mar. 27, 1981

[51] Int. Cl.³ .............................................. C01B 21/06
[52] U.S. Cl. .................................... 264/29.1; 264/60; 264/62; 264/63; 264/65; 264/67; 264/332; 501/154
[58] Field of Search ..................... 264/63, 65, 67, 332, 264/60, 62, 29.1; 501/154

[56] References Cited

U.S. PATENT DOCUMENTS

| | | |
|---|---|---|
| 3,394,991 | 7/1968 | Evans . |
| 3,413,090 | 11/1968 | Krock ................................ 423/344 |
| 3,519,399 | 7/1970 | Kyle . |
| 3,520,740 | 7/1970 | Addamiano . |
| 3,607,067 | 9/1971 | Nickl . |
| 3,615,878 | 10/1971 | Chang et al. . |
| 3,835,211 | 9/1974 | Coe et al. . |
| 3,959,446 | 5/1976 | Mazdiyasni et al. . |
| 4,117,095 | 9/1978 | Komeya et al. . |
| 4,122,152 | 10/1978 | Mori et al. . |
| 4,127,630 | 11/1978 | Washburn ............................ 264/65 |
| 4,145,224 | 3/1979 | Mehalchick et al. . |

FOREIGN PATENT DOCUMENTS

| | | |
|---|---|---|
| 938776 | 12/1973 | Canada ................................. 264/65 |
| 1949587 | 8/1970 | Fed. Rep. of Germany ........ 264/65 |
| 2356921 | 5/1974 | Fed. Rep. of Germany . |
| WO80/00021 | 1/1980 | PCT Int'l Appl. .................. 264/65 |
| 1274212 | 5/1972 | United Kingdom . |
| 1490543 | 11/1977 | United Kingdom . |

*Primary Examiner*—John A. Parrish

*Attorney, Agent, or Firm*—Finnegan, Henderson, Farabow, Garrett & Dunner

[57] ABSTRACT

Method for producing α-silicon nitride whiskers. Silicon is blended with composition particles able to sublime without leaving a residue, such as naphthalene particles. The blend is compacted to a desired shape, after which the composition particles are sublimed from the blend to form a porous silicon precursor compact having the desired shape. The silicon precursor is reacted with a substance that releases free nitrogen, such as nitrogen or dry ammonia. The reaction is carried out at a temperature sufficiently high to form an identically shaped porous compact of α-silicon nitride whiskers but sufficiently low to avoid subliming substantially all of the formed whiskers. Preferably, the reaction is carried out in a range between about 2100° F. and 2750° F. The shaped porous compact of α-silicon nitride whiskers may be impregnated with a resin binder, a liquid metal, a colloidal suspension, an ionic solution or a gaseous material to form an isotropic composite. Alternatively, the compact of α-silicon nitride whiskers formed by the method described above may be broken down by crushing or grinding to form individual whiskers. Preferably, silicon particles in powder form are mixed with about 5 to 20 weight percent of composition particles, such as naphthalene particles, and treated so that the silicon particles are coated by the composition particles. The coated silicon particles are blended with more of the composition particles, followed by the steps outlined above to produce a loose compact of α-silicon nitride whiskers. A loose compact so produced breaks down more easily into individual whiskers, which whiskers can be added as reinforcement to metal, ceramic or resin molding powders and then formed by conventional methods, such as compacting, to produce composite parts in which α-silicon nitride is the reinforcing phase.

39 Claims, 5 Drawing Figures

Fig. 1
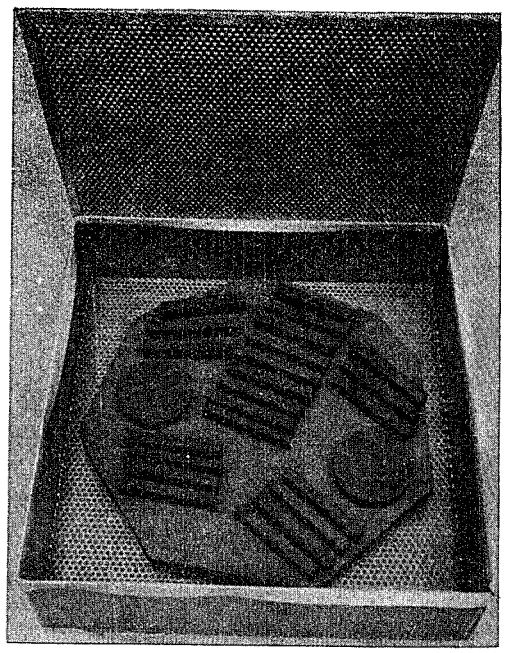
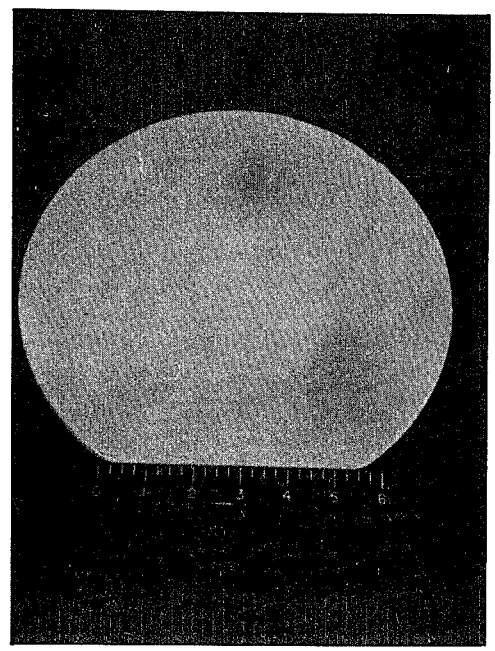
Fig. 2

Fig. 3
Fig. 4
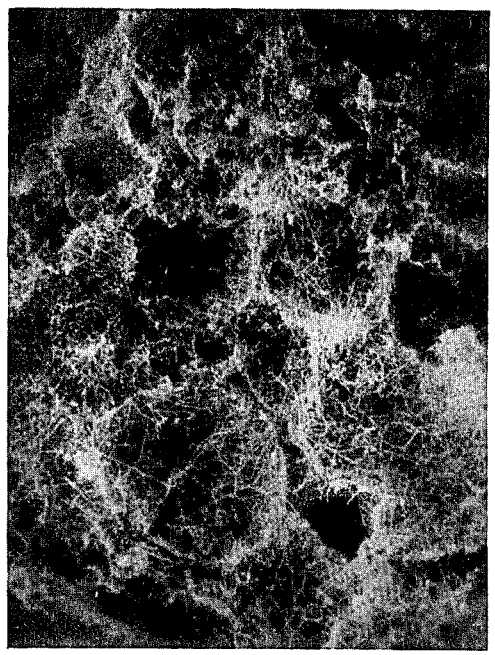
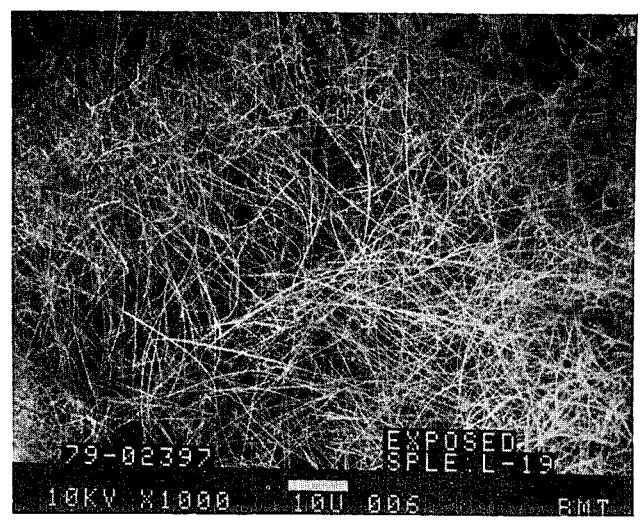
Fig. 5

METHOD FOR PRODUCING PRE-SHAPED α-SILICON NITRIDE WHISKER COMPACTS AND LOOSE WHISKERS FOR COMPOSITE MATERIAL REINFORCEMENT

BACKGROUND OF THE INVENTION

This invention relates to a method for producing low cost α-silicon nitride pre-shaped whisker compacts in which the whiskers are omni-directional and can be used as the high-modulus, high-strength reinforcing phase for metal, organic and ceramic matrix phase composites. The invention also relates to a method for producing α-silicon nitride whiskers for blending with metal, organic and ceramic molding powders to provide a high-strength, high-modulus reinforcing phase for composite parts produced from the blended molding powders.

Workers in the art have sought to produce reinforcement materials in the form of elongated, single-crystal fibres known as whiskers. The term whiskers generally applies to any single-crystal fibre having a thickness less than about 0.1 mm. and a length to thickness ratio of at least 100.

Whiskers are potentially important in the reinforcement of metals and other materials because of their shape, high-modulus of elasticity and high tensile strength. When dispersed in metals, the elongated shape of whiskers renders them difficult particles to displace to the grain boundaries, thus significantly increasing the creep resistance of the metal. Further, the high elastic modulus and tensile strength of many whiskers makes it possible for them to act as reinforcement for producing materials having superior strength to weight and stiffness to weight properties.

Workers are particularly interested in whiskers made from very stiff and light covalent compounds such as carbides, nitrides and oxides, which have elastic moduli higher than most metals and are also often many times stronger than steel, especially in proportion to their weight.

In general, workers have experienced extreme difficulties in successfully scaling-up laboratory methods for producing such whiskers. The yields and efficiencies of previous processes, moreover, have been found to be low. Further, the previous processes often produce whiskers in a variety of polymorphic forms, making it difficult to isolate a particular polymorph having a desired property such as thermal stability.

A specific compound that has been produced in whisker form is aluminum oxide (sapphire). The preparation of sapphire is difficult, however, because slight variations in process conditions greatly affect the quality of sapphire produced. The difficulties related to the preparation of sapphire whiskers have also been accompanied by prohibitively high costs.

Silicon carbide is another compound that has been produced in whisker form. Although produced at low cost, silicon carbide whiskers presently available are unfortunately contaminated by large quantities of non-fibrous particulate material. Silicon carbide, moreover, disadvantageously reacts chemically with some matrix materials and thus may fail to act as an independent reinforcing phase in such applications.

α-Silicon nitride is known to be a highly desirable reinforcement material which does not react chemically with matrix materials. Prior art attempts, however, to produce uncontaminated whiskers of α-silicon nitride have been extremely costly. Accordingly, the art has sought an improved method for producing α-silicon nitride whiskers and an improved method for dispersing the whiskers uniformly in a matrix phase.

SUMMARY OF THE INVENTION

The present invention overcomes the problems and disadvantages of the prior art by producing uncontaminated α-silicon nitride whiskers at a reasonable cost either as uniform preformed shaped compacts ready for infiltration by a binder matrix phase or as individual particles for blending with molding powders. Therefore, an object of the present invention is to produce uncontaminated α-silicon nitride whiskers at a reasonable cost as either a shaped preform or as individual whiskers. This is accomplished by blending silicon particles with composition particles that can be sublimed without leaving a residue. Compacting the blend of silicon particles and composition particles to a shaped preform, followed by subliming the composition particles from the blend, produces a shaped porous silicon precursor, which precursor shape can then be reacted with nitrogen to form a similarly shaped compact of α-silicon nitride whiskers. The shaped whisker compact can be impregnated with various materials to form dense isotropic shaped composites. Alternatively, the shaped compact may be broken down to form individual whiskers useful as reinforcement for metal, ceramic or resin molding powders.

Additional objects and advantages of the invention will be set forth in part in the description which follows, and in part will be obvious from the description or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the method for producing a pre-shaped compact of omni-directional α-silicon nitride whiskers according to the present invention comprises the steps of (a) blending silicon particles with fugitive composition particles able to sublime without leaving a residue; (b) compacting the blend to a desired shape; (c) subliming the fugitive composition particles from the blend to form a porous silicon compact having the desired shape; and (d) reacting the shaped silicon compact with a substance that releases free nitrogen, the reaction occurring at a temperature sufficiently high to convert the shaped silicon compact to an identically shaped porous compact of α-silicon nitride whiskers but sufficiently low to avoid subliming substantially all of the formed whiskers.

Further to achieve the foregoing objects and in accordance with the purpose of the invention, as embodied and broadly described herein, the method for producing isotropic composites reinforced by α-silicon nitride whiskers according to the present invention comprises impregnating the shaped porous compact of α-silicon nitride whiskers with a material selected from the group consisting of a resin binder, a liquid metal, a colloidal suspension, an ionic salt solution and at least one gaseous material to form an isotropic composite reinforced by α-silicon nitride.

Still further to achieve the foregoing objects and in accordance with the purpose of the invention, as embodied and broadly described herein, the method for producing individual α-silicon nitride whiskers according to the present invention comprises the steps of (a) mixing silicon particles in powder form with about 5 to 20 weight percent of fine fugitive composition particles able to sublime without leaving a residue; (b) treating the mixture of silicon particles and fugitive composition particles to coat the silicon particles with the fugitive composition particles; (c) blending the coated silicon particles with more fugitive composition particles; (d) compacting the blend; (e) subliming the fugitive composition particles from the blend to form a loosely-compacted silicon precursor; (f) reacting the silicon precursor with a substance that releases free nitrogen, the reaction occurring at a temperature sufficiently high to convert the loosely-compacted silicon precursor to loosely-compacted α-silicon nitride whiskers but sufficiently low to avoid subliming substantially all of the whiskers which are formed; and (g) breaking down the loosely-compacted α-silicon nitride whiskers to obtain individual whiskers.

Further to achieve the foregoing objects and in accordance with the purpose of the invention, as embodied and broadly described herein, the method for producing composite parts using a molding powder reinforced by α-silicon nitride whiskers according to the present invention comprises mixing the individual whiskers obtained with a molding powder and forming the mixture of whiskers and molding powder into a reinforced composite part.

The accompanying drawings, which are incorporated in and constitute a part of this specification, illustrate embodiments of the invention and together with the description, serve to explain the principles of the invention.

BRIEF DESCRIPTION OF THE DRAWINGS

FIG. 1 shows precursor pressed shapes of silicon and fugitive naphthalene.

FIG. 2 shows a nitrided plate of α-silicon nitride whiskers.

FIG. 3 shows the structure of a nitrided plate of α-silicon nitride whiskers, magnified one hundred times.

FIG. 4 shows the structure of a nitrided plate of α-silicon nitride whiskers, magnified four hundred times.

FIG. 5 shows the structure of a nitrided plate of α-silicon nitride whiskers, magnified one thousand times.

DETAILED DESCRIPTION OF THE PREFERRED EMBODIMENTS

Reference will now be made in detail to the presently preferred embodiments of the invention, examples of which are illustrated in the accompanying drawings.

In accordance with the invention, silicon particles are blended with fugitive composition particles able to sublime without leaving a residue. Any commercially available silicon particles may be employed. Silicon particles in powder form are preferred.

For blending with the silicon particles, particles of numerous fugitive compositions able to sublime without leaving a residue, including naphthalene, camphor and carbon dioxide, provided that the carbon dioxide is maintained under cryogenic conditions, are suitable. Preferably, naphthalene particles are blended with the silicon particles.

Preferably, about 25% to 90% by weight silicon particles of sufficient fineness are blended by conventional means to coat the composition particles. At least about 25% by weight silicon is needed to maintain a network of the desired shape after sublimation of composition particles that is capable of subsequently reacting with free nitrogen, to form a similar shaped α-silicon nitride whisker compact. If more than 90% by weight silicon particles is used, however, the silicon matrix remaining after sublimation of the composition is too dense for practical use. Most preferably, about 25% to 60% by weight silicon particles are blended.

The density of the compact of α-silicon nitride whiskers ultimately produced, which density controls the concentration of the reinforcing phase in the final composite, is itself controlled by varying the amount of silicon used within the 25% to 90% by weight range. Utilizing silicon amounts in the lower portion of the range results in compacts with more open space, whereas utilizing silicon amounts in the higher portion of the range results in closer pacted compacts that require less matrix phase addition.

It is preferred that the composition particles be from 100 to 10,000 times larger than the silicon particles. When naphthalene is selected for blending with the silicon particles, the preferred average size of the silicon particles is from about 2 to 6 microns (equivalent diameter). The naphthalene particles are preferably from about 0.20 to 0.60 mm. (equivalent diameter) in size. Since silicon and naphthalene powders have opposite electrostatic charges, the smaller silicon particles adhere to and coat the larger naphthalene particles.

In accordance with the invention, the silicon-composition blend is compacted to a desired shape, as is shown in FIG. 1. Conventional means may be employed, such as die pressing or hydrostatic pressing. Pressures ranging from about 1,000 to 30,000 psi may be used.

In accordance with the invention, the composition particles are removed from the shaped compact by sublimation to leave an openly porous silicon precursor compact that maintains the desired shape. For example, silicon-naphthalene compacts are baked at a temperature below the melting temperature of naphthalene, i.e., 176°–180° F., preferably in a vacuum. Sublimation of the composition particles leaves a porous skeletal compact of silicon. Often, the skeletal compact is highly porous.

In accordance with the invention, the porous shaped silicon compact is reacted with a substance that releases free nitrogen. The reaction occurs at a temperature sufficiently high to convert the shaped silicon compact to an identically shaped porous compact of α-silicon nitride whiskers but sufficiently low to avoid subliming substantially all of the formed whiskers.

Suitable reactive substances that release free nitrogen include nitrogen, dry ammonia, a mixture of hydrogen and dry ammonia, a mixture of nitrogen and dry ammonia, a mixture of hydrogen and nitrogen, and a mixture of nitrogen, dry ammonia and hydrogen. A preferred reactive substance is nitrogen containing from about 1 to 10 volume percent of a chemical selected from the group consisting of hydrogen and dry ammonia.

A preferred temperature range for reacting the silicon matrix with nitrogen is about 2100° F.–2750° F. Below 2100° F., although some reaction occurs, not all the free nitrogen and silicon react. Above 2750° F., the α-silicon nitride formed begins to sublime. A particularly preferred temperature range is about 2550° F. to 2600° F.

In accordance with the invention, the reaction of the silicon matrix with nitrogen is carried out long enough to completely transform the silicon precursor to an identically shaped compact of α-silicon nitride whiskers, as shown in FIGS. 2–5. Preferably, the silicon matrix and nitrogen are reacted for a period of time ranging from about 1 to 8 hours.

In a preferred embodiment of the invention, reinforced, isotropic composites are formed. Preferably, the reinforced isotropic composites are dense reinforced isotropic composites. Specifically, in accordance with the invention, a shaped compact of α-silicon nitride whiskers, formed as described above, is impregnated with a material selected from the group consisting of resin binders, liquid metals, aqueous colloidal suspensions, ionic solutions and at least one gaseous material to form an isotropic composite material in which the whiskers provide reinforcement for the added matrix phase.

Suitable resin binders include acrylic resins, polyimide resins, phenolic resins, epoxy resins and silicone resins. Conventional vacuum infiltration means can be utilized to pull uncured resin into the porous compact of α-silicon nitride whiskers, followed by polymerization or curing of the resin within the whisker matrix by conventional means.

Suitable liquid metals include those having low melting points, such as aluminum, magnesium, silver and copper. By conventional means, such as vacuum infiltration, the porous compact of α-silicon nitride whiskers is impregnated by a liquid metal. Solidification of the metal is accomplished by such means as a cooling step. For certain metals, it may be necessary to treat the liquid metal with a wetting agent, such as lithium, prior to impregnating the porous compact of whiskers, to facilitate the wetting of the whiskers by the metal.

Suitable aqueous colloidal suspensions are those having colloids small enough to penetrate the pore size of the α-silicon nitride whiskers compact. Preferred aqueous colloidal suspensions are selected from the group consisting of silica and alumina. By means such as vacuum infiltration, the whisker compact is impregnated by an aqueous colloidal suspension, followed by a drying step to remove the aqueous phase. If necessary, the dried impregnated compact can be consolidated by sintering to form the desired composite. Multiple cycles of impregnation, drying and sintering may be used to produce the desired density and strength properties.

If aqueous colloidal silica is used, the aqueous phase is removed by a drying step and then consolidated by sintering at a temperature of about 1800° to 2200° F. When aqueous colloidal alumina is used, a sintering temperature of about 2500° to 2700° F. is employed for consolidating the alumina matrix phase.

Suitable ionic solutions useful in the process of the present invention include aluminum nitrate, nickel chloride and boric acid. After impregnation of the solution into the whisker compact by conventional means, the aqueous phase is removed by a drying step, leaving the desired residue in the whisker compact to be converted to the matrix phase.

For example, aluminum nitrate may be introduced into the whisker compact by such conventional means as vacuum infiltration, followed by a heating step to drive off water and nitrous oxide, leaving aluminum oxide reinforced by the matrix of α-silicon nitride whiskers.

Nickel chloride may be introduced into the whisker compact by appropriate means, followed by a thermal treatment in an oxidizing atmosphere to drive off water and chlorine and produce nickel oxide residue in the whisker compact. The remaining nickel oxide can be reduced to nickel metal by an appropriate step such as firing in a reducing atmosphere containing hydrogen. Several cycles may be required to achieve the desired densities. A secondary forming step such as hot pressing may be desired for certain applications to further increase density and strength.

Suitable gaseous materials are selected from the group consisting of any gaseous material which can be cracked to convert it to a solid and at least two gaseous materials which react in form a solid material. Preferably, the gaseous material is selected from the group consisting of silicon tetrachloride, silicon tetrafluoride, ammonia, nitrogen, hydrogen and methane. More preferably, methane gas ($CH_4$) that disassociates on striking the heated whisker structure to form carbon (C) and silicon tetrachloride and ammonia which form silicon nitride ($Si_3H_4$) are employed. Most preferably, the gaseous material is a mixture containing at least one gaseous material selected from the group consisting of silicon tetrachloride and silicon tetrafluoride and at least one gaseous material selected from the group consisting of ammonia, nitrogen and hydrogen and further including the step of heating the porous shaped compact of α-silicon nitride, whereby the gaseous material mixture reacts to form a dense form of silicon nitride, the silicon nitride being reinforced with α-silicon nitride whiskers. The gaseous materials are passed through the heated whisker compact under reduced pressure.

Further, methane gas may be introduced into the α-silicon nitride shaped whisker compact, followed by pyrolysis of the methane to form a carbon matrix reinforced by the α-silicon nitride whiskers.

Further, any two gaseous materials which react to form a solid can be introduced into the whisker compact, followed by reaction to form a reinforced solid.

In another preferred embodiment of the invention, individual α-silicon nitride whiskers are produced. One may convert the compact of α-silicon nitride whiskers, formed by the above-described method, to individual whiskers by grinding or crushing the compact. It is preferable, however, to produce a weaker, looser compact or network of α-silicon nitride whiskers, since the weaker compact will facilitate formation of individual particles.

To accomplish this, in accordance with a preferred embodiment of the present invention, silicon particles in powder form are premixed with about 5 to 20 weight percent of the above-described fugitive composition particles which are able to sublime without leaving a residue. Preferably, the fugitive composition particles are present in a fine form. As before, naphthalene is preferably used.

In accordance with the invention, the silicon-composition mixture is treated to ensure coating of the silicon particles by the composition. Preferably, conventional ball milling is utilized to coat the silicon particles by the milled composition particles.

Preferably, the silicon particles mixed with the composition particles are 2 to 6 microns (equivalent diameter) in size. Since the composition particles are soft, they are readily reduced during ball-milling to very fine powder, whereas little change occurs in the 2 to 6 micron silicon, resulting in a fine coating of composition on the silicon.

In accordance with the invention, the composition-coated silicon is then blended with more particles of the above-described composition. Preferably, the composition particles blended with the composition-coated silicon have a size ranging from 100 to 10,000 times larger than the size of the silicon particles. More preferably, the composition particles have a size ranging from 0.20 to 0.60 mm. Preferably, moreover, the sizes of the composition particles after completion of the treatment step are relatively smaller than the sizes of the composition particles blended with the coated silicon particles.

In accordance with the invention, the composition-coated blend is compacted and baked to achieve sublimation of the composition particles leaving a loosely compacted silicon precursor. Preferably, sublimation of the fugitive composition particles results in an exceedingly loose structure of silicon particles. The loosely compacted silicon precursor is reacted with a substance releasing free nitrogen as previously described. Owing to the treatment to coat the silicon particles by the composition, a weaker network of whiskers is formed than when silicon and composition particles are blended together without the mixing and treatment steps. Thus, the loosely compacted α-silicon whiskers network, when broken down in accordance with the invention by crushing or grinding, results in more individual whiskers and less particulate matter.

In a further embodiment, the invention comprises producing α-silicon nitride whiskers for blending with molding powders to form composite parts reinforced by α-silicon nitride whiskers. In accordance with the invention, the individual α-silicon nitride whiskers obtained above are mixed with a molding powder selected from the group consisting of metal, ceramic and resin molding powders and formed by conventional processes applying heat and pressure to form α-silicon nitride-reinforced composite parts. Preferably the forming is accomplished by conventional compacting, accompanied by heat and pressure. Preferred metal molding powders to be reinforced include aluminum, titanium, molybdenum and columbium. Preferred ceramic molding powders include silicate glass, alumina, aluminum silicates and other clay materials. Preferred resin molding powders include bakelite, phenolics, epoxys, polyimides, acrylic and silicones.

The following examples were designed to elucidate the teachings of the present invention, and in no way limit the scope of the invention. Various other modifications and equivalents of the examples will readily suggest themselves to those of ordinary skill in the art, particularly after the issuance of this patent, without departing from the spirit or scope of the present invention.

EXAMPLE I

Twenty-eight parts by weight silicon powder having an average particle size of 3.7 microns equivalent diameter were blended with 72 parts by weight naphthalene particles sized to pass a 48 mesh sieve. The bleneded particles were charged into a steel die and pressed to form a shaped part using a pressure of 10,000 psi. The formed part was ejected from the die and placed on a setting plate of silicon nitride and heated in a vacuum oven at a reduced pressure equivalent to 28 in. Hg for 86 hours. During the vacuum treatment, the naphthalene sublimed leaving an openly porous skeletal network of silicon particles that retained the original shape of the compact. The silicon compact was then fired by heating it in 8.5 hours to 2650° F. in an atmosphere of nitrogen-4% hydrogen. The resultant material was a compact of randomly oriented silicon nitride whiskers. The compact has essentially the same shape and dimensions as the precursor silicon naphthalene compact. The structure of the compact was like that shown in FIGS. 3–5.

EXAMPLE II

The procedure described in Example I was repeated except that the silicon skeletal compact was fired from ambient temperature to 2350° F. in approximately 4 hours in an atmosphere of dry ammonia diluted with nitrogen and hydrogen.

EXAMPLE III

By a procedure similar to that described in Example I, silicon precursors were fabricated using both plate-like particles and spheres of naphthalene ranging in size from material that passes a 28 mesh sieve (595 micron openings) down to material that passes a 100 mesh sieve (149 micron openings). The silicon precursors were successfully converted to similarly sized compacts of α-silicon nitride whiskers.

EXAMPLE IV

By a procedure similar to that described in Example I, silicon precursors were fabricated using as low as 25 parts by weight silicon to 75 parts by weight naphthalane to as high as 90 parts by weight silicon to 10 parts by weight naphthalene. The silicon precursors were successfully converted to similarly sized compacts of α-silicon whiskers.

EXAMPLE V

An α-silicon nitride whisker compact produced by the procedure described in Example I was immersed in a vessel containing a clear 2 part commercial epoxy, Stycast 1269A. The vessel was placed in an oven at 250° F. and the oven was evacuated. When bubbling stopped, the oven was back-filled with air and the temperature was reduced to 215° F. for 72 hours to allow the epoxy to cure and form a solid 2-phase composite material. Excess epoxy was trimmed from the exterior of the α-silicon nitride compact to provide an epoxy-silicon nitride composite part with the shape and size of the original α-silicon nitride compact.

EXAMPLE VI

An α-silicon nitride whisker compact produced by the procedure described in Example I was impregnated with a 2 part silicone, Dow Corning Silgard 184, under vacuum at room temperature for 16 hours until the silicone had stopped bubbling and had a tacky consistency. The impregnated part was then heated to 160° F. for 4 hours to set the silicone and form an elastomeric solid. The excess clear rubber-like silicone could be trimmed from the surface of the whisker compact to leave a silicon nitride whisker reinforced silicone composite.

EXAMPLE VII

An α-silicon nitride whisker compact produced by the procedure described in Example I was impregnated with a high viscosity polyimide Dupont NR150 resin by deairing the compact and resin in a vacuum at 27 in. Hg. The vessel containing the resin and compact was sealed with a rubber diaphragm and placed under a pressure of 2500 psi in a hydrostatic press to force the high viscosity resin into the deaired porous compact. The compact filled wih the NR150 resin was then cured under pressure at 500° F. to form a solid polyimide-silicon nitride composite part having the shape of the original whisker compact.

EXAMPLE VIII

An α-silicon nitride whisker compact produced by the procedure described in Example I was impregnated with a commercial colloidal silica suspension Ludox AS under vacuum at 27 in Hg. at ambient temperature. The saturated compact was heated in vacuum to 160° F. to remove free water. The compact was fired in air to 1800° F. to form a silica-α-silicon nitride composite. Other samples were produced by heating in nitrogen to 2200° F. and by heating in air to 2000° F. Density of the porous composites was increased by a second vacuum infiltration and firing step.

EXAMPLE IX

An α-silicon nitride whisker compact produced by the procedure described in Example I was vacuum impregnated with a 10 percent by weight solution of boric acid in water. The whisker compact was placed in a heated solution of boric acid in a vacuum equivalent to 27 in. Hg and brought to a boil. The vacuum was released, and the saturated compact was removed from the oven and allowed to dry over night under ambient conditions. The sample was heated in air to 1000° F. to eliminate chemically-combined water and then fired to 2550° F. in an atmosphere of dry ammonia diluted with nitrogen and hydrogen to form a boron nitride-silicon nitride composite.

EXAMPLE X

α-silicon nitride whiskers for use as an additive to aluminum powder for hot molding a dense plate of composite material were prepared by the following procedure:
1. 900 g. of −325 mesh silicon powder were mixed with 100 gms of naphthalene flake and ball milled in a gallon jar mill using alumina grinding media until the naphthalene was completely broken down to coat the silicon and form a free flowing powder.
2. The naphthalene-silica powder mix was blended with naphthalene flakes sized to pass a 48 mesh sieve in a ratio of 1 part fine silicon-naphthalene powder to 3 parts coarse powder.
3. The blended powder mix was pressed to form briquets using a pressure of 10,000 psi.
4. The briquets were placed on silicon nitride setters and baked at 160° F. under vacuum to remove the fugitive naphthalene.
5. The skeletal briquets of silicon were then fired in an atmosphere of dry ammonia diluted with nitrogen and hydrogen to about 2600° F. The samples were heated from ambient temperature to 2600° F. in about 8.5 hours and then allowed to furnace cool with the power off.
6. The resultant soft briquets were crushed in a mortar with a pestle to form small agglomerates of α-silicon nitride whiskers.
7. The small agglomerates were further broken down to individual whiskers by mixing them with a desired molding powder in a liquid slurry and blending them using a high speed high shear mixer and/or ultrasonic agitation.

It will be apparent to those skilled in the art that various modifications and variations can be made in the methods of the present invention without departing from the scope or spirit of the invention. Thus, it is intended that the present invention cover the modifications and variations of the invention provided they come within the scope of the appended claims and their equivalents.

I claim:
1. A method for producing a pre-shaped compact of α-silicon nitride whiskers comprising the steps of:
    (a) blending silicon particles with fugitive composition particles able to sublime without leaving a residue;
    (b) compacting the blend to a desired shape;
    (c) subliming and fugitive composition particles from said compacted shape to form a porous silicon precursor compact having said desired shape;
    (d) reacting said shaped silicon compact with a substance that releases free nitrogen, said reaction occurring at a temperature sufficiently high to convert said shaped silicon compact to an identically shaped porous compact of α-silicon nitride whiskers but sufficiently low to avoid subliming substantially all of said formed whiskers.
2. The method of claim 1 wherein said composition particles are selected from the group consisting of napthalene, camphor and carbon dioxide; wherein said substance is selected from the group consisting of nitrogen, dry ammonia, a mixture of hydrogen and dry ammonia, a mixture of nitrogen and dry ammonia, mixture of hydrogen and nitrogen, and a mixture of nitrogen, dry ammonia and hydrogen; and wherein said temperature ranges between about 2100° F. and 2750° F.
3. The method of claim 2 wherein said temperature ranges between about 2550° F. and 2600° F.
4. The method of claim 2 wherein said composition particles are form about 100 to 10,000 times larger than said silicon particles and wherein said compacting step utilizes pressures ranging from about 1,000 to 30,000 psi.
5. The method of claim 2 wherein said substance and said silicon compact are reacted for a paired of time ranging from about 1 to 48 hours.
6. The method of claim 2 wherein said composition particles are naphthalene and wherein said substance is nitrogen containing from about 1 to 10 volume percent of a chemical selected from the group consisting of hydrogen and dry ammonia.
7. The method of claim 6 wherein said subliming is accomplished by baking said blend at a temperature below the melting point of naphthalene.
8. The method of claim 7 wherein said baking occurs in a vacuum.
9. The method of claim 6 wherein said silicon particles range from about 2 to 6 microns (equivalent diameter) in size and further wherein said naphthalene particles range from about 0.20 to 0.60 mm. (equivalent diameter) in size.
10. The method of claim 6 wherein said silicon particles are blended in powder form.
11. The method of claim 2 wherein said compacting is accomplished by die pressing.
12. The method of claim 2 wherein said compacting is accomplished by hydrostatic pressing.
13. The method of claim 2 wherein said blend is compacted into a shaped part.

14. The method of claim 2 further including the step of converting said compact of silicon nitride whiskers into individual α-silicon nitride whiskers.

15. The method of claim 2 wherein about 25% to 90% by weight silicon particles are blended with said composition particles.

16. The method of claim 15 wherein about 25% to 60% by weight silicon particles are blended with said composition particles.

17. A method for producing isotropic composites reinforced by α-silicon nitride whiskers comprising the steps of:
(a) blending silicon particles with fugitive composition particles able to sublime without leaving a residue;
(b) compacting the blend to a desired shape;
(c) subliming said fugitive composition particles from said compacted shape to form a porous silicon precursor compact having said desire shape;
(d) reacting said shaped silicon compact with a substance that releases free nitrogen, said reaction occurring at a temperature sufficiently high to convert said compact to an identically shaped porous compact of α-silicon nitride whiskers but sufficiently low to avoid subliming substantially all of said formed whiskers; and
(e) impregnating said shaped porous compact of α-silicon nitride whiskers with a material selected from the group consisting of a resin binder, a liquid metal, a colloidal suspension, an ionic solution and at least one gaseous material to form an isotropic composite reinforced by α-silicon nitride whiskers.

18. The method of claim 17 wherein said material is a resin binder selected from the group consisting of acrylic, polyimide, phenolic, epoxy and silicone.

19. The method of claim 18, further including the step of polymerizing the material in said reinforced composite.

20. The method of claim 17 wherein said material is a liquid metal selected from the group consisting of aluminum, magnesium, silver and copper.

21. The method of claim 20 further including the step of treating said liquid metal with a wetting agent prior to said impregnating step to facilitate the wetting of said whiskers by said metal.

22. The method of claim 20 further including the step of solidifying the liquid metal after said impregnating step.

23. The method of claim 17 wherein said material is an aqueous colloidal suspension selected from the group consisting of silica and alumina.

24. The method of claim 23 further including the steps of:
(a) drying said impregnated matrix to remove said aqueous phase; and
(b) sintering said dried impregnated matrix.

25. The method of claim 17 wherein said material is an ionic solution selected from the group consisting of aluminum nitrate, nickel chloride and boric acid.

26. The method of claim 25 further including the step of decomposing said solution after said impregnating step to form a solid.

27. The method of claim 17 wherein said material is at least one gaseous material which can be converted to a solid.

28. The method of claim 27 wherein said gaseous material is selected from the group consisting of silicon tetrachloride, silicon tetrafluoride, ammonia, nitrogen, hydrogen and methane.

29. The method of claim 28, wherein said gaseous material is methane and further including the step of pyrolyzing said methane after said impregnating step to convert it to carbon.

30. The method of claim 28, wherein about 60–90 weight percent of said silicon particles are blended with said composition particles and wherein said gaseous material is a mixture containing at least one gaseous material selected from the group consisting of silicon tetrachloride and silicon tetrafluoride, and at least one gaseous material selected from the group consisting of dry ammonia, nitrogen and nitrogen with hydrogen, and further including the step of heating said porous shaped compact of α-silicon nitride whiskers whereby said gasous material mixture reacts to form of silicon nitride, which is reinforced with α-silicon nitride whiskers.

31. The method of claim 17, wherein about 60–90 weight percent of said silicon particles are blended with said composition particles.

32. A method for producing individual α-silicon nitride whiskers comprising the steps of:
(a) coating silicon particles in powder form with about 5 to 20 weight percent of fugitive composition particles able to sublime without leaving a residue;
(b) blending the coated silicon particles with additional fugitive composition particles, said additional fugitive composition particles being larger than said composition particles coating said silicon particles;
(c) compacting the blend;
(d) subliming said fugitive composition particles from said blend to form a loosely-compacted silicon precursor;
(e) reacting said silicon precursor with a substance that releases free nitrogen, said reaction occurring at a temperature sufficiently high to convert said loosely-compacted silicon precursor to loosely-compacted α-silicon nitride whiskers but sufficiently low to avoid subliming substantially all of said whiskers which are formed; and
(f) breaking down said loosely-compacted α-silicon nitride whiskers to obtain individual whiskers.

33. The method of claim 32 wherein said coating of said silicon particles is accomplished by mixing said silicon particles and said fugitive composition particles by ball milling; wherein said composition is selected from the group consisting of naphthalene, camphor and carbon dioxide; wherein said substance is selected from the group consisting of nitrogen, dry ammonia, a mixture of hydrogen and dry ammonia, a mixture of nitrogen and dry ammonia, a mixture of hydrogen and nitrogen, and a mixture of nitrogen, dry ammonia and hydrogen; and wherein said temperature ranges between about 2100° F. and 2750° F.

34. The method of claim 33 wherein said temperature ranges between about 2300° F. and 2600° F.

35. The method of claim 33 wherein said composition is napthalene and wherein said substance is nitrogen containing from about 1 to 10 volume percent of a chemical selected from the group consisting of hydrogen and dry ammonia.

36. A method for producing composite parts using a molding powder reinforced by α-silicon nitride whiskers comprising the steps of:

(a) mixing silicon particles in powder form with about 5 to 20 weight percent of fugitive composition particles able to sublime without leaving a residue;
(b) treating said mixture of silicon particles and composition particles to coat said silicon particles with said composition particles;
(c) blending the coated silicon particles with more of said composition particles;
(d) compacting the blend;
(e) subliming said composition particles from said blend to form a loosely-compacted silicon precursor;
(f) reacting said silicon precursor with a substance that releases free nitrogen, said reaction occurring at a temperature sufficiently high to convert said loosely-compacted silicon precursor to loosely-compacted $\alpha$-silicon nitride whiskers but sufficiently low to avoid subliming substantially all of said whiskers which are formed;
(g) breaking down said loosely-compacted $\alpha$-silicon nitride whiskers to obtain individual whiskers;
(h) mixing said $\alpha$-silicon nitride whiskers with a molding powder; and
(i) forming said mixture of whiskers and molding powder into a reinforced composite part.

37. The method of claim 36 wherein said molding powder is selected from the group consisting of metal molding powder, ceramic molding powder and resin molding powder.

38. The method of claim 36 wherein the particle sizes of said composition particles after completion of said treatment step are relatively smaller than the sizes of said composition particles which are blended with said coated silicon particles.

39. The method of claim 36 wherein said forming step (i) is accomplished by compacting, said compacting being accompanied by heat and pressure.

* * * * *

UNITED STATES PATENT AND TRADEMARK OFFICE
CERTIFICATE OF CORRECTION

PATENT NO. : 4,388,255
DATED : June 14, 1983
INVENTOR(S) : Frederick H. Simpson

It is certified that error appears in the above—identified patent and that said Letters Patent is hereby corrected as shown below:

Claim 1, line 7, replace "and" by --said--.

Claim 4, line 2, change "form" to --from--.

Claim 5, line 2, change "paired" to --period--.

Claim 17, line 10, change "desire" to --desired--.

Claim 27, line 2, after "material" delete "which can be converted to a solid".

Claim 30, line 11, delete "of".

Signed and Sealed this

Thirtieth Day of August 1983

[SEAL]

Attest:

GERALD J. MOSSINGHOFF

Attesting Officer

Commissioner of Patents and Trademarks